US011886117B2

(12) United States Patent
Tang et al.

(10) Patent No.: US 11,886,117 B2
(45) Date of Patent: Jan. 30, 2024

(54) ADHESION PROMOTER AND PHOTOSENSITIVE RESIN COMPOSITION CONTAINING SAME

(71) Applicant: SHANDONG SHENGQUAN NEW MATERIALS CO LTD., Jinan (CN)

(72) Inventors: Diyuan Tang, Jinan (CN); Zhifang Li, Jinan (CN); Ke Bai, Jinan (CN); Bin Liu, Jinan (CN); Chuanming Sun, Jinan (CN)

(73) Assignee: SHANDONG SHENGQUAN NEW MATERIALS CO LTD., Jinan (CN)

( * ) Notice: Subject to any disclaimer, the term of this patent is extended or adjusted under 35 U.S.C. 154(b) by 71 days.

(21) Appl. No.: 17/624,261

(22) PCT Filed: Jul. 2, 2019

(86) PCT No.: PCT/CN2019/094434
§ 371 (c)(1),
(2) Date: Dec. 31, 2021

(87) PCT Pub. No.: WO2021/000265
PCT Pub. Date: Jan. 7, 2021

(65) Prior Publication Data
US 2022/0373887 A1 Nov. 24, 2022

(51) Int. Cl.
*G03F 7/075* (2006.01)
*G03F 7/022* (2006.01)

(52) U.S. Cl.
CPC .......... *G03F 7/0751* (2013.01); *G03F 7/0226* (2013.01); *G03F 7/0755* (2013.01)

(58) Field of Classification Search
CPC ...... G03F 7/0751; G03F 7/085; G03F 7/0236; G03F 7/0755; G03F 7/0226; C07F 7/1804
See application file for complete search history.

(56) References Cited

U.S. PATENT DOCUMENTS 10,385,076 B2 * 8/2019 Mori .................... A61K 31/53

FOREIGN PATENT DOCUMENTS

CN 1802608 B 6/2010
CN 102317295 A 1/2012
(Continued)

OTHER PUBLICATIONS

Fang Wang et al (Self-assembled monolayer of designed and synthesized triazinedithiolsilane molecule as interfacial adhesion enhancer for integrated circuit.) Nanoscale Research Letters 2011 6:483 (Year: 2011).*
(Continued)

*Primary Examiner* — John S Chu
*Assistant Examiner* — Andrew Preston Traywick
(74) *Attorney, Agent, or Firm* — Bayramoglu Law Offices LLC

(57) ABSTRACT

An adhesion promoter as shown in Formula (I) and a photosensitive resin composition containing the adhesion promoter are disclosed:

Formula (I)

$$X-A-Si(OR_1)(OR_2)(OR_3),$$

where $R_1$, $R_2$ and $R_3$ each refer to a hydrogen atom, an optionally substituted $C_1$-$C_{20}$ alkyl, an optionally substituted $C_2$-$C_{20}$ alkenyl, an optionally substituted $C_2$-$C_{20}$ alkynyl, an optionally substituted phenyl, or other optionally substituted carbon atom; A refers to an optionally substituted $C_1$-$C_{20}$ alkyl, an optionally substituted $C_2$-$C_{20}$ alkenyl, an optionally substituted
(Continued)

$C_2$-$C_{20}$ alkynyl, an optionally substituted phenyl, or other an optionally substituted carbon atom substituents; and the carbon in the alkyl, the alkenyl, the alkynyl, the phenyl, or the carbon atom substituents is optionally substituted with one or more of N, O and S; and X refers to an optionally substituted aromatic heterocyclic group. The adhesion promoter and the photosensitive resin composition can be used for manufacturing a semiconductor integrated circuit (IC), a LED and a flat-panel display.

5 Claims, 1 Drawing Sheet

(56) References Cited

FOREIGN PATENT DOCUMENTS

| | | | | |
|---|---|---|---|---|
| CN | 102445853 A | | 5/2012 | |
| CN | 109062008 A | * | 12/2018 | ............. G03F 7/039 |
| CN | 109062008 A | | 12/2018 | |
| CN | 109400543 A | | 3/2019 | |
| WO | 2008150568 A2 | | 12/2008 | |
| WO | 2010062416 A1 | | 6/2010 | |

OTHER PUBLICATIONS

Translated Description of Huang (2018) (Year: 2018).*

* cited by examiner

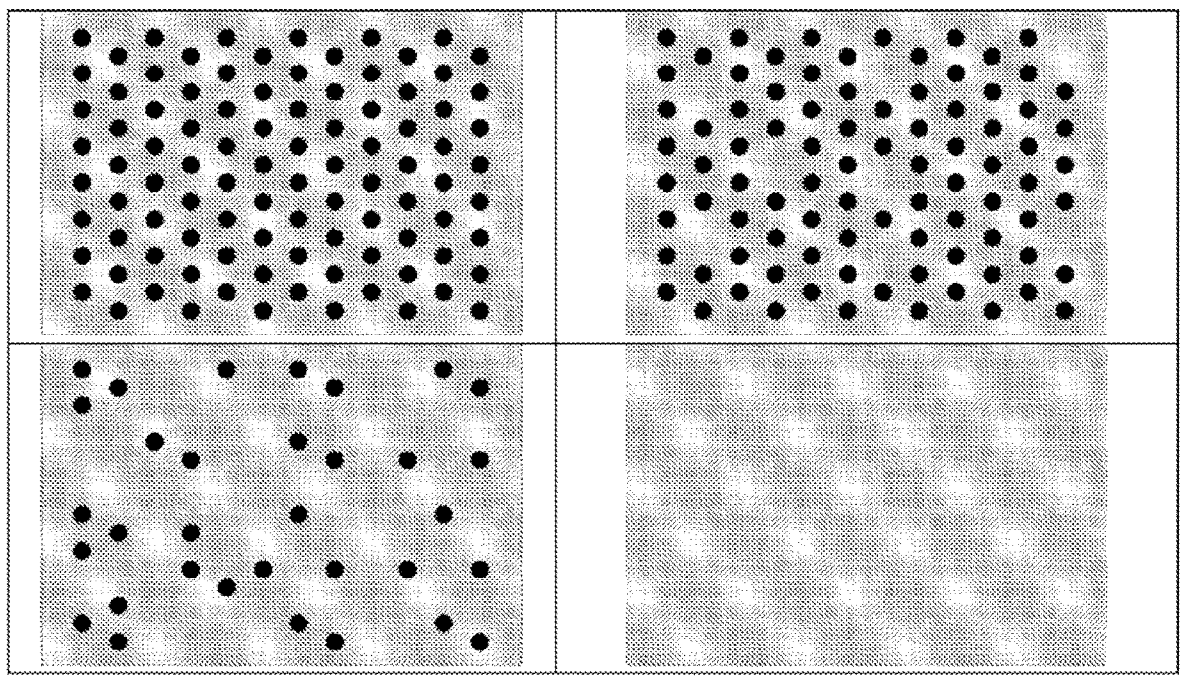

ADHESION PROMOTER AND PHOTOSENSITIVE RESIN COMPOSITION CONTAINING SAME

CROSS REFERENCE TO THE RELATED APPLICATIONS

This application is the national phase entry of International Application No. PCT/CN2019/094434, filed on Jul. 2, 2019, the entire contents of which are incorporated herein by reference.

TECHNICAL FIELD

The present invention relates to the technical field of photoresists, and specifically relates to an adhesion promoter and a photosensitive resin composition containing the same.

BACKGROUND

As a photoresist (also known as an optical resist) can undergo a photochemical reaction under light, after the photoresist is coated on a semiconductor, a conductor, or an insulator, a part left after exposure and development achieves a protection effect on a bottom layer. Then, a required fine pattern can be transferred from a mask to a to-be-processed substrate by conducting etching with an etching agent. The photoresist is a key chemical material in a micro-processing technology and is mainly used in micro-processing of integrated circuits, flat-panel displays, light-emitting diodes (LEDs), printed circuit boards (PCBs) and precision sensors.

The pattern is transferred from the mask to a surface of a wafer in several steps. Most of photolithography processes are variations or options of a ten-step method of basic photolithography.

Step 1, surface preparation: a surface of a substrate is cleaned and spin-dried. During manufacturing of the integrated circuits, the flat-panel displays and LED chips, a silicon substrate, a glass substrate, a sapphire substrate, or a metal film, a non-metal film, a metal oxide film, or a non-metal oxide film laid on the silicon substrate, the glass substrate, or the sapphire substrate can be used as a substrate material.

Step 2, photoresist coating: a thin layer of a photoresist is coated on the surface of the substrate. Types of the photoresist include: a positive photoresist, such as a photoresist formed by phenolic aldehyde and an azidoquinone compound, where a pattern formed on the substrate is the same as that on a mask; and a negative photoresist, such as a photoresist formed by using polyvinyl laurate as a photosensitive material, where a pattern formed on the substrate is opposite to that on the mask. A photoresist coating method includes a brushing method, a rolling method and a soaking method.

Step 3, soft baking: a photoresist solvent is partially evaporated by heating. For example, a hot plate, a convection oven, an infrared oven, a microwave oven, or a vacuum oven is used.

Step 4, alignment and exposure: the mask is aligned with the substrate to expose the photoresist. There are many types of lithography machines, such as a contact lithography machine, a proximity lithography machine, a projection lithography machine and a stepping lithography machine. Exposure light sources include ultraviolet (UV), deep ultraviolet (DUV), X-ray and the like.

Step 5, development: a non-polymer photoresist is removed. For example, immersion development, spray development, coagulation development and scum removal of plasma are conducted. An alkaline developing solution is mainly used as a developing solution. An aqueous solution of tetramethylammonium hydroxide is commonly used as the developing solution. Other alkaline developing solutions, such as aqueous solutions of ammonia, alkali metal hydroxides, alkylamine, alkanolamine, corrin and tetraalkylammonium hydroxide, can also be used for development.

Step 6, hard baking: the solvent is continuously evaporated. A device and a method used in the hard baking are similar to those in the soft baking. A convection oven, an online and manual hot plate, an infrared tunnel oven, a moving belt conduction oven and a vacuum oven are all used in the hard baking.

Step 7, development inspection: surface alignment and defects are inspected.

Step 8, etching: a top layer of the substrate is removed through an opening of the photoresist. The etching includes dry etching and wet etching.

Step 9, photoresist removal: also referred to as stripping, the photoresist on the substrate is completely removed.

Step 10, final inspection: surface inspection is conducted for etching irregularity and other problems.

For example, a sapphire chip used for the LEDs is produced by using a patterned sapphire substrate (PSS) technology. The PSS technology includes engraving a sapphire substrate with a corresponding pattern by using a photoresist, etching the sapphire by using an inductively coupled plasma etching technology, removing the photoresist, and then allowing a GaN material to grow on the sapphire. The adhesion between the photoresist as an etching barrier and a surface layer of the substrate needs to be great, so that the pattern can be truly transferred to the surface of the substrate. When the adhesion is low, the pattern will be changed.

In order to improve the adhesion between a photosensitive resin composition and a substrate, an adhesion promoter is usually added into the photosensitive resin composition. For example, according to CN1802608B, a nitrogen compound or a thiadiazole compound substituted with a sulfonyl is added. A mechanism of the adhesion promoter is as follows: the adhesion of a substrate side is improved by a cyclic nitrogen compound; as the sulfonyl and a hydroxyl in a phenolic resin varnish achieve a hydrogen bonding effect, the corrosion of an alkaline substance during development can be prevented, and reduction of the adhesion is avoided. The adhesion promoter contains the sulfur element, which may have a corrosion effect on the substrate. Therefore, a milder adhesion promoter is required.

SUMMARY

An objective of the present patent is to provide an adhesion promoter and a photosensitive resin composition containing the adhesion promoter. The photosensitive resin composition can be used for manufacturing a semiconductor integrated circuit (IC), a light-emitting diode (LED) and a flat-panel display (FPD), such as a liquid crystal display (LCD) and an organic light-emitting display (OLED).

According to one aspect of the present invention, an adhesion promoter is provided, as shown in Formula (I):

Formula (I)

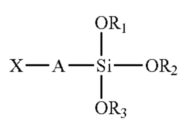

$R_1$, $R_2$ and $R_3$ each refers to a hydrogen atom, a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, a phenyl optionally substituted with a substituent, or other carbon atom substituents optionally substituted with a substituent, and carbon in the alkyl, the alkenyl, the alkynyl, the phenyl, or the other carbon atom substituents is optionally substituted with one or more of N, O and S; A refers to a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, a phenyl optionally substituted with a substituent, or other carbon atom substituents optionally substituted with a substituent, and carbon in the alkyl, the alkenyl, the alkynyl, the phenyl, or the other carbon atom substituents is optionally substituted with one or more of N, O and S; and X refers to an aromatic heterocyclic group optionally substituted with a substituent.

In a preferred aspect, $R_1$, $R_2$ and $R_3$ each refers to a hydrogen atom, a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, or a phenyl optionally substituted with a substituent.

In another preferred aspect, $R_1$, $R_2$ and $R_3$ each refers to a hydrogen atom, a $C_1$-$C_{20}$ alkyl optionally substituted with a substituent, a $C_2$-$C_{20}$ alkenyl optionally substituted with a substituent, or a $C_2$-$C_{20}$ alkynyl optionally substituted with a substituent.

In another preferred aspect, $R_1$, $R_2$ and $R_3$ each refers to a hydrogen atom, a $C_1$-$C_{10}$ alkyl optionally substituted with a substituent, a $C_2$-$C_{10}$ alkenyl optionally substituted with a substituent, or a $C_2$-$C_{10}$ alkynyl optionally substituted with a substituent.

In another preferred aspect, $R_1$, $R_2$ and $R_3$ each refers to a hydrogen atom, a $C_1$-$C_6$ alkyl optionally substituted with a substituent, a $C_2$-$C_6$ alkenyl optionally substituted with a substituent, or a $C_2$-$C_6$ alkynyl optionally substituted with a substituent.

In another preferred aspect, $R_1$, $R_2$ and $R_3$ each refers to a $C_1$-$C_6$ alkyl optionally substituted with a substituent.

In another preferred aspect, $R_1$, $R_2$ and $R_3$ each refers to an ethyl optionally substituted with a substituent.

In a preferred aspect, A refers to a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, or a phenyl optionally substituted with a substituent, and carbon in the alkyl, the alkenyl, the alkynyl, or the phenyl is optionally substituted with one or more N.

In another preferred aspect, A refers to a $C_1$-$C_{20}$ alkyl optionally substituted with a substituent, a $C_2$-$C_{20}$ alkenyl optionally substituted with a substituent, or a $C_2$-$C_{20}$ alkynyl optionally substituted with a substituent, and carbon in the alkyl, the alkenyl, or the alkynyl is optionally substituted with one or more N.

In another preferred aspect, A refers to a $C_1$-$C_{10}$ alkyl optionally substituted with a substituent, a $C_2$-$C_{10}$ alkenyl optionally substituted with a substituent, or a $C_2$-$C_{10}$ alkynyl optionally substituted with a substituent, and carbon in the alkyl, the alkenyl, or the alkynyl is optionally substituted with one or more N.

In another preferred aspect, A refers to a $C_1$-$C_6$ alkyl optionally substituted with a substituent, a $C_2$-$C_6$ alkenyl optionally substituted with a substituent, or a $C_2$-$C_6$ alkynyl optionally substituted with a substituent, and carbon in the alkyl, the alkenyl, or the alkynyl is optionally substituted with one or more N.

In another preferred aspect, A refers to a $C_1$-$C_6$ alkyl optionally substituted with a substituent, and carbon in the alkyl is optionally substituted with one or more N.

In another preferred aspect, A refers to a propyl optionally substituted with a substituent, and carbon in the propyl is optionally substituted with one or more N, such as 1, 2, or 3, preferably 1, or 2, and more preferably 1. The substitution may occur at any position of the propyl, such as the 1st position, the 2nd position, or the 3rd position.

In a preferred aspect, X refers to a 6-membered aromatic heterocyclic group optionally substituted with a substituent.

In another preferred aspect, X refers to a 6-membered nitrogen-containing aromatic heterocyclic group optionally substituted with a substituent.

In another preferred aspect, X refers to a 6-membered nitrogen-containing aromatic heterocyclic group optionally substituted with a substituent, and nitrogen is 1-4, preferably 1-3, more preferably 2-3, and most preferably 3.

In another preferred aspect, X refers to pyridine, pyrimidine, or triazine optionally substituted with a substituent.

In another preferred aspect, X refers to triazine optionally substituted with a substituent, preferably 1,3,5-triazine.

In a preferred aspect, the adhesion promoter is 2-triethoxysilylpropyl-4,6-amino-1,3,5-triazine, and the structure is as follows:

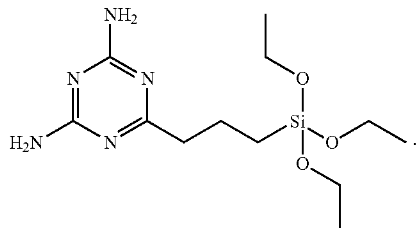 [SMILES: CCO[Si](CCCc1nc(N)nc(N)n1)(OCC)OCC]

In a preferred aspect, the adhesion promoter is 2-(triethoxysilyl-methylamino-methyl)-4,6-amino-1,3,5-triazine, and the structure is as follows:

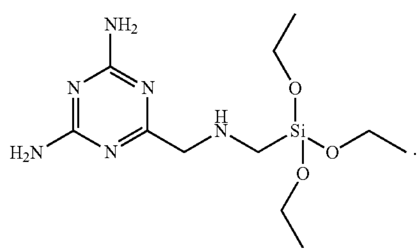 [SMILES: CCO[Si](CNCc1nc(N)nc(N)n1)(OCC)OCC]

According to another aspect of the present invention, a photosensitive resin composition is provided. The photosensitive resin composition includes the adhesion promoter.

In a preferred aspect, the photosensitive resin composition further includes one or two of an alkali-soluble phenolic resin varnish and a naphthoquinonediazide photosensitive compound.

In a preferred aspect, the photosensitive resin composition further includes the alkali-soluble phenolic resin varnish and the naphthoquinonediazide photosensitive compound.

In a preferred aspect, the photosensitive resin composition further includes one or more of other adhesion promoters.

In a preferred aspect, based on a solid content of the resin varnish and the photosensitive compound, an added amount of the adhesion promoter is 10-50000 ppm, preferably 100-50000 ppm, and more preferably 1000-10000 ppm.

According to another aspect of the present invention, use of the adhesion promoter or the photosensitive resin composition is provided. The adhesion promoter and the photosensitive resin composition can be used for manufacturing a semiconductor integrated circuit (IC), a light-emitting diode (LED) and a flat-panel display (FPD), such as a liquid crystal display (LCD) and an organic light-emitting display (OLED). A silicon substrate, a glass substrate, a sapphire substrate, or a metal film, a non-metal film, a metal oxide film, or a non-metal oxide film laid on the silicon substrate, the glass substrate, or the sapphire substrate can be used as a substrate material.

In a preferred aspect, the adhesion promoter and the photosensitive resin composition can be used in a patterned sapphire substrate (PSS) process.

According to the adhesion promoter of the present invention, on the one hand, lone pair electrons of a nitrogen atom in a molecule and a surface of the substrate form a covalent bond; and on the other hand, the binding force between the molecule and the phenolic resin varnish is improved by a hydrophobic group in the molecule. Therefore, the adhesion between the photosensitive resin composition and the substrate is improved, and deformation of a pattern during development is prevented.

As shown in embodiments, by using the adhesion promoter of the present invention, all dot patterns with different sizes on a mask are accurately transferred to the sapphire substrate. When the adhesion promoter is not used or other types of adhesion promoters are used, the patterns are not completely transferred. It is fully indicated that the adhesion promoter of the present invention has high effectiveness. In the PSS process, the adhesion between the photosensitive resin composition and the sapphire is improved, and the yield of a product is increased.

BRIEF DESCRIPTION OF THE DRAWINGS

FIGURE shows patterns formed after development of photoresists with different properties, where a blue color refers to a sapphire wafer, and a black dot refers to a photoresist after exposure and development. When all the dots are not stripped, it is indicated that the adhesion is high, and ● is marked. When a part of the dots is stripped, ◎ is marked. When most of the dots are stripped, it is indicated that the adhesion is low, and ○ is marked. When all the dots are stripped, x is marked.

DETAILED DESCRIPTION OF THE EMBODIMENTS

Specific embodiments of the present invention are described in detail below with reference to the accompanying drawings. Although the specific embodiments of the present invention are shown in the drawings, it should be understood that the present invention can be implemented in various forms and should not be limited to the embodiments described herein. On the contrary, the embodiments are provided to achieve a more thorough understanding of the present invention and to enable a person skilled in the art to fully understand the scope of the present invention.

Subjects of the present disclosure can be embodied in many different forms and should not be construed as being limited to the embodiments described herein. In fact, various modifications and other embodiments of the subjects of the present disclosure including teaching benefits given in the description of the present invention will be obtained by a person skilled in the art to which the subjects of the present disclosure belong. Therefore, it should be understood that the subjects of the present disclosure are not limited to the specific embodiments disclosed, and the modifications and other embodiments are intended to be included in the scope of the disclosed subjects.

Although specific terms are used in the present invention, they are only used to achieve a general and descriptive meaning, rather than to achieve a limiting purpose. Unless otherwise defined, all technical and scientific terms used herein have the same meaning as those commonly understood by a person of ordinary skill in the art to which the subjects described in the present disclosure belong.

Compounds are described by using standard nomenclature. Unless otherwise defined, all technical and scientific terms used herein have the same meaning as those commonly understood by a person skilled in the art to which the present invention belongs.

The compounds described herein in any formula include an enantiomer, a mixture of enantiomers, a diastereomer, a cis/trans-isomer, a tautomer, a racemate and other isomers, such as a rotamer, as if each compound is specifically described.

The compounds in any formula can be prepared from a suitable optically pure precursor by chiral or asymmetric synthesis, or prepared from a racemate, an enantiomer, or a mixture of diastereomers by using any conventional technology, such as chromatographic resolution using a chiral column and thin layer chromatography (TLC), or prepared by preparing a diastereomer and separating and regenerating a required enantiomer or diastereomer. For example, "Enantiomers, Racemates and Resolutions," by J. Jacques, A. Collet, and S. H. Wilen, (Wiley-Interscience, New York, 1981); S. H. Wilen, A. Collet, and J. Jacques, *Tetrahedron,* 2725 (1977); E. L. Eliel *Stereochemistry of Carbon Compounds* (McGraw-Hill, N Y, 1962); and S. H. Wilen *Tables of Resolving Agents and Optical Resolutions* 268 (E. L. Eliel ed., Univ. of Notre Dame Press, Notre Dame, Ind., 1972), *Stereochemistry of Organic Compounds*, Ernest L. Eliel, Samuel H. Wilen and Lewis N. Manda (1994 John Wiley & Sons, Inc.), and *Stereoselective Synthesis A Practical Approach*, Mihály Nógrádi (1995 VCH Publishers, Inc., NY, NY) are taken as references.

The term "one" does not indicate a limit of quantity, but indicates that there is at least one referenced item. A numerical range is merely described as a shorthand method for separately referring to each individual value falling within the range. Unless otherwise indicated herein, each individual value is incorporated into the specification as if it is individually recited in the present invention. End values of all ranges are included in the ranges and can be separately combined. Unless otherwise indicated herein or clearly contradictory to the context, all methods described herein can be performed in an appropriate order. Unless otherwise stated, the use of examples or exemplary languages (such as "for example") is merely intended to better illustrate the present invention, rather than to limit the scope of the present invention.

The present invention includes a compound as shown in Formula (I) having at least one desired atomic isotope substitution whose quantity is higher than the natural abundance (namely enrichment) of an isotope, and use of the compound. Isotopes are atoms having the same atomic number but different mass numbers. That is to say, the isotopes have the same number of protons but different numbers of neutrons. The isotopic substitution, such as deuterium substitution, can be partial or complete. A partial deuterium substitution indicates that at least one hydrogen is substituted with deuterium. In some embodiments, the isotopes are enriched by 90%, 95%, 99% or above at any interested location. In an embodiment, deuterium is enriched by 90%, 95%, or 99% at a desired location.

It should be noted that some words used in the specification and claims refer to specific components. A person skilled in the art should understand that different terms may be used to refer to the same component. In the specification and claims, the components are distinguished based on functions of the components, rather than differences of the terms. For example, "include" or "comprise" mentioned in the entire specification and claims is an open term, and should be interpreted as "include but not limited to". Following descriptions of the specification are preferred implementations for implementing the present invention. The descriptions are based on general principles of the specification and are not intended to limit the scope of the present invention. The protection scope of the present invention shall be subjected to those defined by the appended claims.

The term "or" in the claims is used to indicate "and/or" unless it is clearly stated that "or" only refers to alternatives or the alternatives are mutually exclusive, although the present disclosure supports the meaning that "or" only refers to alternatives and the definition of "and/or". As used herein, "another" can indicate at least a second one or more.

In the present invention, an "alkyl" refers to a linear saturated aliphatic hydrocarbyl. In some embodiments, the alkyl refers to a $C_1$-$C_6$ alkyl, a $C_1$-$C_{10}$ alkyl, or a $C_1$-$C_{20}$ alkyl (that is, an alkyl chain including 1, 2, 3, 4, 5, 6, 7, 8, 9, 10, 11, 12, 13, 14, 15, 16, 17, 18, 19, or 20 carbons in length). As used herein, a specified range includes an alkyl with the length of each member described as an independent species of the range. For example, as used herein, the term $C_1$-$C_6$ alkyl refers to a linear or branched alkyl having 1, 2, 3, 4, 5, or 6 carbon atoms, and is intended to indicate that each of these alkyls is described as an independent species. The alkyl can be further substituted with an alkyl to form a branched alkyl. Examples of the alkyl include, but are not limited to, methyl, ethyl, n-propyl, isopropyl, n-butyl, isobutyl, sec-butyl, tert-butyl, n-pentyl, isopentyl, tert-pentyl, neopentyl, n-hexyl, 2-methylpentane, 3-methylpentane, 2,2-dimethylbutane and 2,3-dimethylbutane. In an embodiment, the alkyl is optionally substituted with the substituent described above.

In the present invention, an "alkenyl" is a linear aliphatic hydrocarbyl having one or more carbon-carbon double bonds, which have independent cis-structures or trans-structures and can occur at stable locations on a chain. A non-limiting example is a $C_2$-$C_{20}$ alkenyl, a $C_2$-$C_{10}$ alkenyl, or a $C_2$-$C_6$ alkenyl (that is, an alkenyl having 2, 3, 4, 5, 6, 7, 8, 9, 10, 11, 12, 13, 14, 15, 16, 17, 18, 19, or 20 carbons). As used herein, a specified range includes an alkenyl of each member described as an independent species of the range, as described above with respect to the alkyl. Examples of the alkenyl include, but are not limited to, vinyl and propenyl. The alkenyl can be further substituted with an alkyl to form a branched alkenyl. In an embodiment, the alkenyl is optionally substituted with the substituent described above.

In the present invention, an "alkynyl" is a linear aliphatic hydrocarbyl having one or more carbon-carbon triple bonds, which can occur at any stable location on a chain, such as a $C_2$-$C_{20}$ alkynyl, a $C_2$-$C_{10}$ alkynyl, or a $C_2$-$C_6$ alkynyl (that is, an alkynyl having 2, 3, 4, 5, 6, 7, 8, 9, 10, 11, 12, 13, 14, 15, 16, 17, 18, 19, or 20 carbons). As used herein, a specified range includes an alkynyl of each member described as an independent species of the range, as described above with respect to the alkyl. The alkynyl can be further substituted with an alkyl to form a branched alkynyl. Examples of the alkynyl include, but are not limited to, ethynyl, propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl and 5-hexynyl. In an embodiment, the alkynyl is optionally substituted with the substituent described above.

In the present invention, "other carbon atom substituents" indicate that the substituents consist of carbon atoms. Such substituents may be chain-like or cyclic, such as a substituent having 2, 3, 4, 5, 6, 7, 8, 9, 10, 11, 12, 13, 14, 15, 16, 17, 18, 19, or 20 carbons.

In the present invention, an "aromatic heterocyclic group" refers to a stable monocyclic aromatic ring. The aromatic heterocyclic group contains 1 to 3, or in some embodiments, 1 to 2 heteroatoms selected from N, O and S and other ring atoms are carbon; or the aromatic heterocyclic group contains a stable bicyclic or tricyclic system, which contains at least one 5- to 7-membered aromatic ring, and the 5- to 7-membered aromatic ring contains 1, 2, 3, or 4, or in some embodiments, 1 or 2 heteroatoms selected from N, O, B and S and other ring atoms are carbon. In an embodiment, the only heteroatom is nitrogen. In an embodiment, the only heteroatom is oxygen. In an embodiment, the only heteroatom is sulfur. The monocyclic aromatic heterocyclic group usually contains 5 to 7 ring atoms. A heteroaryl is optionally substituted with one or more of the substituents described herein independently.

In the present invention, "optional" indicates that subsequent operations may or may not be conducted. For example, "optionally substituted with a substituent" indicates that a group may be or may not be substituted with a substituent.

In the present invention, the term "substituted" indicates that any one or more of hydrogens on a specified atom or group are substituted with a part selected from a specified group, provided that the normal valence of the specified atom is not exceeded. For example, in an embodiment, when the substituent is an oxo group (that is, ═O), two hydrogens on an atom are substituted.

When the two hydrogens in the aromatic moiety are substituted with the oxo group, an aromatic ring in a corresponding moiety is substituted with an unsaturated ring. For example, a pyridyl substituted with the oxo group is pyridone. Only when stable compounds or useful synthetic intermediates are produced by such combinations, combinations of the substituents and/or variables are permissible.

Specifically, the present invention has the following embodiments.

1. An adhesion promoter is provided, as shown in Formula (I):

Formula (I)

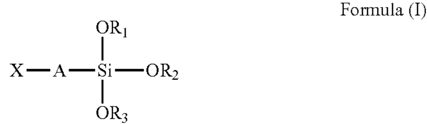

where $R_1$, $R_2$ and $R_3$ each refers to a hydrogen atom, a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, a phenyl optionally substituted with a substituent, or other carbon atom substituents optionally substituted with a substituent, and carbon in the alkyl, the alkenyl, the alkynyl, the phenyl, or the other carbon atom substituents is optionally substituted with one or more of N, O and S; A refers to a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, a phenyl optionally substituted with a substituent, or other carbon atom substituents optionally substituted with a substituent, and carbon in the alkyl, the alkenyl, the alkynyl, the phenyl, or the other carbon atom substituents is optionally substituted with one or more of N, O and S; and X refers to an aromatic heterocyclic group optionally substituted with a substituent.

2. According to the adhesion promoter described above, where $R_1$, $R_2$ and $R_3$ each refers to a hydrogen atom, a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, or a phenyl optionally substituted with a substituent.

3. According to the adhesion promoter described above, where $R_1$, $R_2$ and $R_3$ each refers to a hydrogen atom, a $C_1$-$C_{20}$ alkyl optionally substituted with a substituent, a $C_2$-$C_{20}$ alkenyl optionally substituted with a substituent, or a $C_2$-$C_{20}$ alkynyl optionally substituted with a substituent.

4. According to the adhesion promoter described above, where $R_1$, $R_2$ and $R_3$ each refers to a hydrogen atom, a $C_1$-$C_{10}$ alkyl optionally substituted with a substituent, a $C_2$-$C_{10}$ alkenyl optionally substituted with a substituent, or a $C_2$-$C_{10}$ alkynyl optionally substituted with a substituent.

5. According to the adhesion promoter described above, where $R_1$, $R_2$ and $R_3$ each refers to a hydrogen atom, a $C_1$-$C_6$ alkyl optionally substituted with a substituent, a $C_2$-$C_6$ alkenyl optionally substituted with a substituent, or a $C_2$-$C_6$ alkynyl optionally substituted with a substituent.

6. According to the adhesion promoter described above, where $R_1$, $R_2$ and $R_3$ each refers to a $C_1$-$C_6$ alkyl optionally substituted with a substituent.

7. According to the adhesion promoter described above, where $R_1$, $R_2$ and $R_3$ each refers to an ethyl optionally substituted with a substituent.

8. According to the adhesion promoter described above, where A refers to a $C_1$-$C_{20}$ alkyl optionally substituted with a substituent, a $C_2$-$C_{20}$ alkenyl optionally substituted with a substituent, a $C_2$-$C_{20}$ alkynyl optionally substituted with a substituent, or a phenyl optionally substituted with a substituent, and carbon in the alkyl, the alkenyl, the alkynyl, or the phenyl is optionally substituted with one or more N.

9. According to the adhesion promoter described above, where A refers to a $C_1$-$C_{20}$ alkyl optionally substituted with a substituent, a $C_2$-$C_{20}$ alkenyl optionally substituted with a substituent, or a $C_2$-$C_{20}$ alkynyl optionally substituted with a substituent, and carbon in the alkyl, the alkenyl, or the alkynyl is optionally substituted with one or more N.

10. According to the adhesion promoter described above, where A refers to a $C_1$-$C_{10}$ alkyl optionally substituted with a substituent, a $C_2$-$C_{10}$ alkenyl optionally substituted with a substituent, or a $C_2$-$C_{10}$ alkynyl optionally substituted with a substituent, and carbon in the alkyl, the alkenyl, or the alkynyl is optionally substituted with one or more N.

11. According to the adhesion promoter described above, where A refers to a $C_1$-$C_6$ alkyl optionally substituted with a substituent, a $C_2$-$C_6$ alkenyl optionally substituted with a substituent, or a $C_2$-$C_6$ alkynyl optionally substituted with a substituent, and carbon in the alkyl, the alkenyl, or the alkynyl is optionally substituted with one or more N.

12. According to the adhesion promoter described above, where A refers to a $C_1$-$C_6$ alkyl optionally substituted with a substituent, and carbon in the alkyl is optionally substituted with one or more N.

13. According to the adhesion promoter described above, where A refers to a propyl optionally substituted with a substituent, and carbon in the propyl is optionally substituted with one or more N.

14. According to the adhesion promoter described above, where X refers to a 6-membered aromatic heterocyclic group optionally substituted with a substituent.

15. According to the adhesion promoter described above, where X refers to a 6-membered nitrogen-containing aromatic heterocyclic group optionally substituted with a substituent.

16. According to the adhesion promoter described above, where X refers to a 6-membered nitrogen-containing aromatic heterocyclic group optionally substituted with a substituent, and nitrogen is 1-4, preferably 1-3, more preferably 2-3, and most preferably 3.

17. According to the adhesion promoter described above, where X refers to pyridine, pyrimidine, or triazine optionally substituted with a substituent.

18. According to the adhesion promoter described above, where X refers to triazine optionally substituted with a substituent, preferably 1,3,5-triazine.

19. According to the adhesion promoter described above, where the adhesion promoter is 2-triethoxysilylpropyl-4,6-amino-1,3,5-triazine or 2-(triethoxysilyl-methylamino-methyl)-4,6-amino-1,3,5-triazine.

20. A photosensitive resin composition is provided, where the photosensitive resin composition includes the adhesion promoter described above.

21. According to the photosensitive resin composition described above, where the photosensitive resin composition further includes one or two of an alkali-soluble phenolic resin varnish and a naphthoquinonediazide photosensitive compound.

22. According to the photosensitive resin composition described above, where the photosensitive resin composition further includes the alkali-soluble phenolic resin varnish and the naphthoquinonediazide photosensitive compound.

23. According to the photosensitive resin composition described above, where the photosensitive resin composition further includes one or more of other adhesion promoters.

24. According to the photosensitive resin composition described above, where based on a solid content of the resin varnish and the photosensitive compound, an added amount of the adhesion promoter is 10-50000 ppm, preferably 100-50000 ppm, and more preferably 1000-10000 ppm.

25. Use of the adhesion promoter or the photosensitive resin composition described above is provided, where the adhesion promoter and the photosensitive resin composition are used for manufacturing a semiconductor integrated circuit (IC), a light-emitting diode (LED) and a flat-panel display (FPD), such as a liquid crystal display (LCD) and an organic light-emitting display (OLED).

For example, when the adhesion promoter of the present invention is the 2-triethoxysilylpropyl-4,6-amino-1,3,5-triazine, the 2-triethoxysilylpropyl-4,6-amino-1,3,5-triazine is obtained by conducting a direct silicon/alcohol reaction to synthesize triethoxysilane and then conducting a hydrosilylation reaction on the triethoxysilane. A synthesis route is shown in the following Formula (1). A catalyst A uses copper and a compound thereof as a catalyst precursor. A catalyst B includes Pt, Rh, Ru, Ir and other transition metals and complexes thereof.

Formula (1)

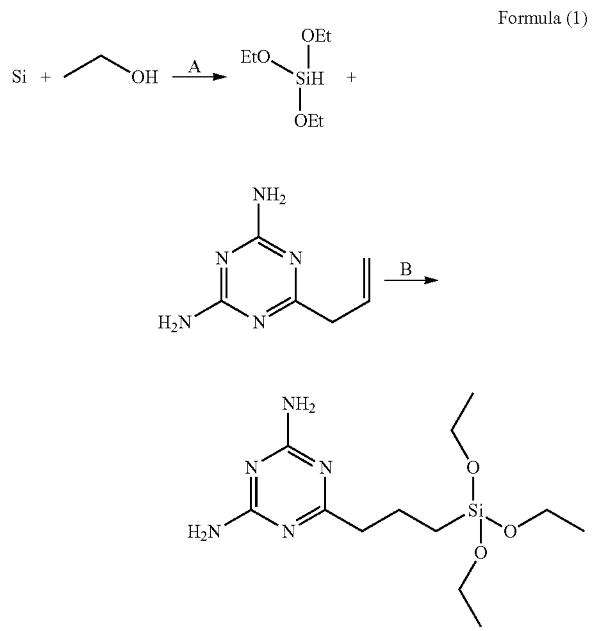

For example, when the adhesion promoter of the present invention is the 2-(triethoxysilyl-methylamino-methyl)-4,6-amino-1,3,5-triazine, it can be obtained by using haloalkylsiloxy silane as a raw material and then conducting a substitution reaction on chlorine of a halohydrocarbyl in the silane with a nucleophilic compound. The nucleophilic compound may be ammonia, primary amine, secondary amine, tertiary amine, phosphine, urea, alcoholate, carboxylate, sulfite, phosphite, alkali metal sulfide, pseudohalide and other functional nucleophilic compounds. A reaction formula is shown as the following Formula (2).

Formula (2)

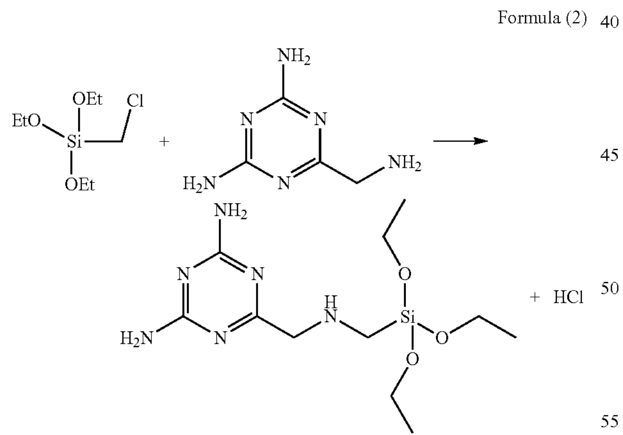

The alkali-soluble phenolic resin varnish in the photosensitive resin composition of the present invention refers to a resin obtained by polycondensation of one or more of phenols and aldehydes such as formaldehyde. The alkali-soluble phenolic resin varnish may be a resin in which components with low molecular weights have not been removed by fractionation, or a resin in which the components with low molecular weights have been removed by fractionation. A method for removing the components with low molecular weights by fractionation may include a liquid-liquid fractionation method, based on a principle that the phenolic resin varnish is fractionated in two solvents with different solubilities. Alternatively, the components with low molecular weights can be removed by centrifugation.

The phenols that can be used for forming the alkali-soluble phenolic resin varnish may include, for example, phenol; cresol, such as 2-cresol, 3-cresol and 4-cresol; dimethylphenol, such as 2,5-dimethylphenol, 3,5-dimethylphenol, 2,3-dimethylphenol and 3,4-dimethylphenol; trimethylphenol, such as 2,3,4-trimethylphenol, 2,3,5-trimethylphenol, 2,4,5-trimethylphenol and 3,4,5-trimethylphenol; ethylphenol, such as 2-ethylphenol, 3-ethylphenol, 4-ethylphenol, 2,3-diethylphenol, 3,5-diethylphenol, 2,3,5-triethylphenol and 3,4,5-triethylphenol; resorcinols, such as resorcinol, 2-methylresorcinol, 4-methylresorcinol and 5-methylresorcinol; catechols, such as 5-methylcatechol; pyrogallols, such as 5-methylpyrogallol; bisphenols, such as bisphenol A, bisphenol B, bisphenol C, bisphenol D, bisphenol E and bisphenol F; chlorophenols, such as 2-chlorophenol, 3-chlorophenol, 4-chlorophenol and 2,3-dichlorophenol; alkoxyphenols, such as 2-methoxyphenol, 3-methoxyphenol, 4-methoxyphenol, 2,3-diethoxyphenol and 2,5-diethoxyphenol; hydroxymethylated phenols, such as 2,6-dihydroxymethyl-p-cresol; and naphthols, such as α-naphthol and β-naphthol. The phenols can be used separately or in combinations.

The aldehydes used for forming the alkali-soluble phenolic resin varnish may include, for example, formaldehyde, acetaldehyde, benzaldehyde, salicylaldehyde, paraformaldehyde, polyformaldehyde, hydroxybenzaldehyde and chloroacetaldehyde. The aldehydes can be used separately or in combinations.

A photosensitizer in the photosensitive resin composition of the present invention is a photosensitive material used for the photosensitive resin composition, and the naphthoquinonediazide photosensitive compound is commonly used. The naphthoquinonediazide photosensitive compound is an ester compound formed by a reaction of a hydroxyl or amino compound and a quinonediazide sulfonyl halide in the presence of an alkaline catalyst, such as sodium hydroxide, sodium carbonate, sodium bicarbonate, or triethylamine. Examples of the quinonediazide compound may include, for example, 1,2-naphthoquinonediazide-4-sulfonyl chloride and 1,2-naphthoquinonediazide-5-sulfonyl chloride. The hydroxy compound that reacts with the quinonediazide sulfonyl halide may include, for example, 2,3,4,4'-tetrahydroxybenzophenone, 2,3,4-trihydroxybenzophenone and 2,4,6-trihydroxybenzophenone. These compounds can be used separately or in combinations.

A solvent in the present invention may include ethylene glycol monoalkyl ethers, such as ethylene glycol monomethyl ether and ethylene glycol monoethyl ether; propylene glycol monoalkyl ethers, such as propylene glycol monomethyl ether and ethylene glycol monoethyl ether acetate; ethylene glycol monoalkyl acetates, such as ethylene glycol monomethyl ether acetate and ethylene glycol monoethyl ether acetate; propylene glycol monoalkyl ether acetates, such as propylene glycol monomethyl ether acetate and propylene glycol monoethyl ether acetate; aromatic hydrocarbons, such as toluene and xylene; lactates, such as methyl lactate and ethyl lactate; ketones, such as methyl ethyl ketone, 2-heptanone and cyclohexanone; alcohols, such as benzyl alcohol and pyridine ethanol; amides, such as N,N-dimethylacetamide and N-methylpyrrolidone; and lactones, such as γ-butyrolactone. These solvents can be used alone or in combinations.

In the present invention, one or more adhesion promoters refer to adhesion promoters with one or more structures shown in Formula (I) and other structures not shown in Formula (I). Based on a solid content of the resin varnish and the photosensitive compound, an added amount of the adhesion promoter is commonly 10-50000 ppm, preferably 100-50000 ppm, and more preferably 1000-10000 ppm.

During manufacturing of the semiconductor integrated circuit (IC) or super large scale integration (LSI), the flat-panel display (FPD), or the light-emitting diode (LED), a photolithography technology is usually used for forming micro-elements or achieving fine processing. According to the photolithography technology, the photosensitive resin composition is usually used as a resist pattern. The photosensitive resin composition is coated on a substrate to manufacture the semiconductor integrated circuit, a color filter, the flat-panel display such as TFT-LCD and the OLED, the organic light-emitting diode and other devices. A glass substrate, a silicon substrate, a sapphire substrate, a metal substrate, or a non-metal substrate with an optional size can be used as a substrate material. A metal film, such as an indium tin oxide (ITO) film, a chromium film and a molybdenum film, a non-metal film, such as a silicon carbide film and a gallium arsenide film, or other metal films, metal oxide films, non-metal films and non-metal oxide films formed on the substrates above can also be used as the substrate material. After the photosensitive resin composition is coated, a part of the solvent is removed by soft baking, followed by exposure and development, and then an etching agent pattern is formed.

The following specific embodiments are used to describe and illustrate the implementations of the present invention in detail, but should not be construed as a limitation to the present invention in any way.

EMBODIMENTS

The following specific embodiments are used to describe and illustrate the implementations of the present invention in detail, but should not be construed as a limitation to the present invention in any way. Unless otherwise specified, materials used in the embodiments are all commercially available products.

| Experiment name | Adhesion promoter name |
|---|---|
| Embodiment 1 | 2-triethoxysilylpropyl-4,6-amino-1,3,5-triazine |
| Embodiment 2 | 2-triethoxysilylpropyl-4,6-amino-1,3,5-triazine |
| Embodiment 3 | 2-(triethoxysilyl-methylamino-methyl)-4,6-amino-1,3,5-triazine |
| Comparative Example 1 | None |
| Comparative Example 2 | 3-aminopropyltriethoxysilane |
| Comparative Example 3 | 1-mesitylenesulfonyl-1,2,4-triazole |
| Comparative Example 4 | Hexamethoxy melamine formaldehyde resin |

Embodiment 1

20 parts of an ester of 1,2-naphthoquinonediazide-5-sulfonyl chloride and 2,3,4,4'-tetrahydroxybenzophenone was added into 100 parts by weight of a phenolic resin varnish (including a phenolic resin 1 (M/P=1:1, Mw=4000) and a phenolic resin 2 (M/P=2:1, Mw=15000) at a weight ratio of 85:15). Based on a total mass of the phenolic resin varnish and the naphthoquinonediazide compound, 2000 ppm of FC-4430 (a surfactant of 3M company) and 1500 ppm of an adhesion promoter 2-triethoxysilylpropyl-4,6-amino-1,3,5-triazine were added to obtain a mixture. The mixture was dissolved in 750 parts of propylene glycol monomethyl ether acetate (relative to 100 parts of the phenolic resin varnish) for stirring to obtain a solution. The solution was filtered with a Teflon filter with a pore size of 0.1 μm to obtain a photosensitive resin composition. The structure of the 2-triethoxysilylpropyl-4,6-amino-1,3,5-triazine was as follows:

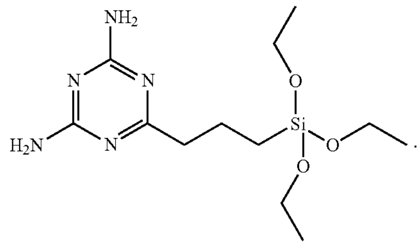 [SMILES: CCO[Si](CCCc1nc(N)nc(N)n1)(OCC)OCC]

Coating: The photosensitive resin composition was spin-coated on a 4-inch silicon wafer.

Soft baking: The silicon wafer was dried on a hot plate at 110° C. for 100 s until a film thickness was 2.5 μm.

Exposure: The silicon wafer was subjected to exposure with NIKON NSR2005i9.

Development: The silicon wafer was subjected to development in a 2.38 wt % aqueous solution of tetramethylammonium hydroxide at 23° C. for 80 s.

Determination of the optimal exposure amount: It was determined by using 1 μm dot patterns (with a dot interval of 1:1) that the optimal exposure amount was 60 mJ/cm$^2$.

The photosensitive resin composition was then coated on a sapphire wafer, and the wafer was aligned with the same mask with different dots (5 μm, 4 μm, 3 μm, 2 μm and 1 μm) for exposure with the exposure amount of 60 mJ/cm$^2$ and development in the 2.38 wt % aqueous solution of tetramethylammonium hydroxide. The number of dots of the photosensitive resin composition remaining on the sapphire wafer was inspected to evaluate the adhesion of the photosensitive resin composition. When all the dots were not stripped, it was indicated that the adhesion was high, and ● was marked. When a part of the dots was stripped, ◎ was marked. When most of the dots were stripped, it was indicated that the adhesion was low, and ○ was marked. When all the dots were stripped, x was marked.

In Embodiment 1, the adhesion promoter was 2-triethoxysilylpropyl-4,6-amino-1,3,5-triazine, and 2-triethoxysilylpropyl-4,6-amino-1,3,5-triazine was obtained by conducting a direct silicon/alcohol reaction to synthesize triethoxysilane and then conducting a hydrosilylation reaction on the triethoxysilane. A synthesis route was shown in the following Formula (1). A catalyst A used copper and a compound thereof as a catalyst precursor. A catalyst B included Pt, Rh, Ru, Ir and other transition metals and complexes thereof.

In Embodiment 1, 1 kg of silicon powder and 100 g of catalyst CuCl (AR (Shanghai test), ≥97.0%) were treated at 450° C. for 5 h, and then 5 kg of ethanol vapor was introduced at 180° C. for reaction for 18 h to obtain the triethoxysilane.

Then, 164 g of the obtained triethoxysilane and 1 g of a platinum catalyst were treated at 150° C. for 2 h, and 154 g of 2-vinylmethyl-4,6-amino-1,3,5 triazine was introduced for reaction at 150° C. for 12 h to obtain the 2-triethoxysilylpropyl-4,6-amino-1,3,5-triazine.

Formula (1)

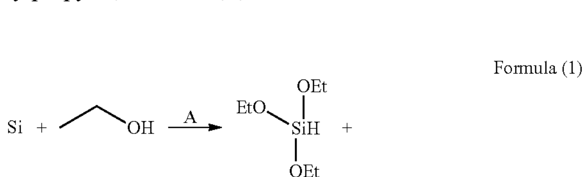

-continued

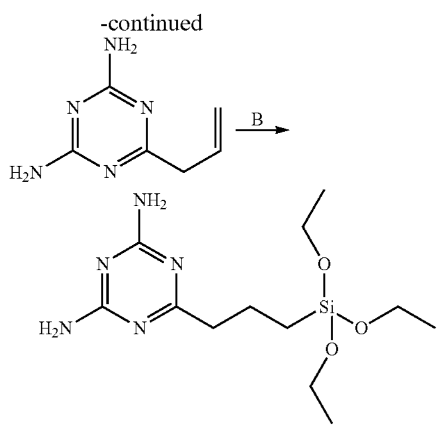

According to mass spectrometry, the 2-triethoxysilylpropyl-4,6-amino-1,3,5-triazine obtained in Embodiment 1 had the following peaks: 2,4-diaminotriazine structure (m/z 110), —$CH_2CH_2CH_2$— (m/z 42), —$SiOCH_2CH_3$ (m/z 73), —$Si(OCH_2CH_3)_2$ (m/z 105), —$Si(OCH_2CH_3)_3$ (m/z 135).

Embodiment 2

Other conditions were the same as those in Embodiment 1, except that the ester of 1,2-naphthoquinonediazide-5-sulfonyl chloride and 2,3,4,4'-tetrahydroxybenzophenone was replaced with 60% of an ester of 1,2-naphthoquinonediazide-5-sulfonyl chloride and 2,3,4,4'-tetrahydroxybenzophenone and 40% of an ester of 1,2-naphthoquinonediazide-5-sulfonyl chloride and 2,3,4-trihydroxybenzophenone.

Embodiment 3

Other conditions were the same as those in Embodiment 1, except that the adhesion promoter was replaced with 2-(triethoxysilyl-methylamino-methyl)-4,6-amino-1,3,5-triazine. The structure of the 2-(triethoxysilyl-methylamino-methyl)-4,6-amino-1,3,5-triazine was as follows:

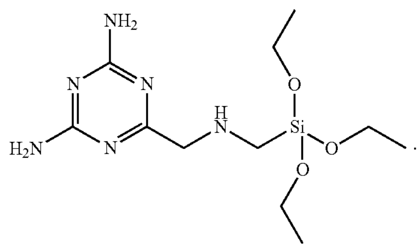 [SMILES: CCO[Si](CNCc1nc(N)nc(N)n1)(OCC)OCC]

In Embodiment 3, the 2-(triethoxysilyl-methylamino-methyl)-4,6-amino-1,3,5-triazine could be obtained by using haloalkylsiloxy silane as a raw material and then conducting a substitution reaction on chlorine of a halohydrocarbyl in the silane with a nucleophilic compound. The nucleophilic compound could be ammonia, primary amine, secondary amine, tertiary amine, phosphine, urea, alcoholate, carboxylate, sulfite, phosphite, alkali metal sulfide, pseudohalide and other functional nucleophilic compounds. A reaction formula was as follows.

In Embodiment 2, 206.5 g of chloromethyl-triethoxysilane and 143 g of 2-aminomethyl-4,6-amino-1,3,5-triazine were subjected to a reaction in a pressurized reactor at 100° C. for 12 h to obtain the 2-(triethoxysilyl-methylamino-methyl)-4,6-amino-1,3,5-triazine.

Formula (2)

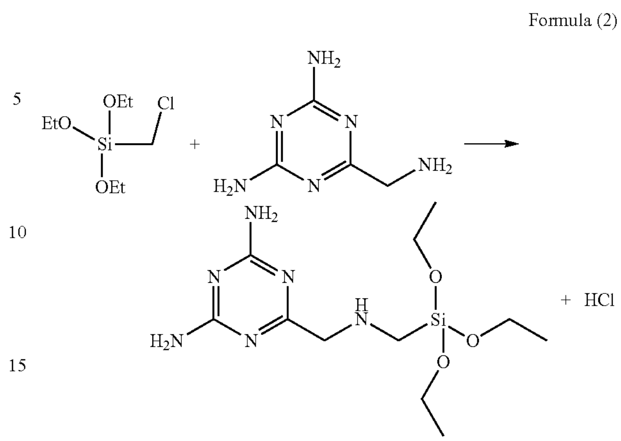

According to mass spectrometry, the 2-(triethoxysilyl-methylamino-methyl)-4,6-amino-1,3,5-triazine obtained in Embodiment 3 had the following peaks: 2,4-diaminotriazine structure (m/z 110), —$SiOCH_2CH_3$ (m/z 73), —$Si(OCH_2CH_3)_2$ (m/z 105), —$Si(OCH_2CH_3)_3$ (m/z 135), —$CH_2NHCH_2$— (m/z 43), —$CH_2NH$— (m/z 29), —NH— (m/z 15).

Comparative Example 1

Other conditions were the same as those in Embodiment 1, except that no adhesion promoter was used.

Comparative Example 2

Other conditions were the same as those in Embodiment 1, except that the 2-triethoxysilylpropyl-4,6-amino-1,3,5-triazine was replaced with 3-aminopropyltriethoxysilane as the adhesion promoter. The structure of the 3-aminopropyltriethoxysilane was as follows:

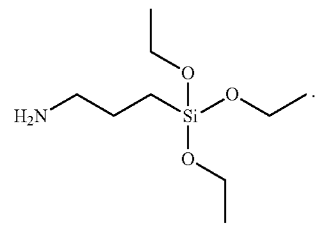

Comparative Example 3

Other conditions were the same as those in Embodiment 1, except that the 2-triethoxysilylpropyl-4,6-amino-1,3,5-triazine was replaced with 1-mesitylenesulfonyl-1,2,4-triazole as the adhesion promoter. The structure of the 1-mesitylenesulfonyl-1,2,4-triazole was as follows:

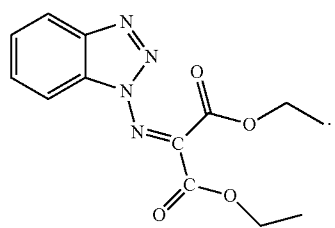 [SMILES: CCOC(=O)C(=Nn1nnc2ccccc21)C(=O)OCC]

Comparative Example 4

Other conditions were the same as those in Embodiment 1, except that the 2-triethoxysilylpropyl-4,6-amino-1,3,5-triazine was replaced with hexamethoxy melamine formaldehyde resin as the adhesion promoter. The structure of the hexamethoxy melamine formaldehyde resin was as follows:

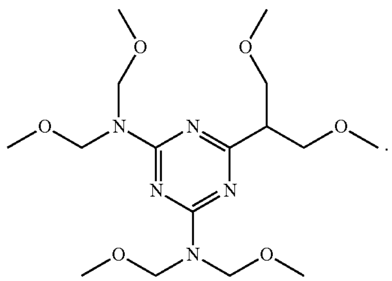

Table 1

| | Embodiment 1 | Embodiment 2 | Embodiment 3 | Comparative Example 1 | Comparative Example 2 | Comparative Example 3 | Comparative Example 4 |
|---|---|---|---|---|---|---|---|
| 5 μm | ● | ● | ● | ○ | ◎ | ◎ | ● |
| 4 μm | ● | ● | ● | X | ◎ | ◎ | ◎ |
| 3 μm | ● | ● | ● | X | ◎ | ◎ | ◎ |
| 2 μm | ● | ● | ● | X | ◎ | ◎ | ◎ |
| 1 μm | ● | ● | ● | X | ◎ | ○ | ◎ |

From the experiments above, it could be seen that by using the 2-triethoxysilylpropyl-4,6-amino-1,3,5-triazine as the adhesion promoter, all dot patterns with different sizes on a mask were accurately transferred to the sapphire substrate. When no adhesion promoter was used or other types of adhesion promoters were used, the patterns were not completely transferred. According to the experiment results, it is fully indicated that the adhesion promoter has high effectiveness. In the PSS process, the adhesion between the photosensitive resin composition and the sapphire is improved, and the yield of a product is increased.

The foregoing merely illustrates the principle of the present invention. It should be understood that the scope of the present invention is not intended to be limited to the exemplary aspects described herein, but should include all currently known equivalents and other equivalents developed in the future. In addition, it should be pointed out that without departing from the technical principle of the present invention, various improvements and modifications can be made, and these improvements and modifications shall be deemed as falling within the scope of the present invention.

What is claimed is:

1. An adhesion promoter, wherein the adhesion promoter is 2-triethoxysibilpropy 5-triazine or 2-(triethoxysilyl-methylamino-methyl)-4, 6-amino- 1,3,5-triazine.

2. A photosensitive resin composition, comprising the adhesion promoter according to claim 1 and at least one of an alkali-soluble phenolic resin varnish and a naphthoquin.onediazide photosensitive compound.

3. The photosensitive resin composition according to claim 2, wherein the photosensitive resin composition further comprises the alkali-soluble phenolic resin varnish and the naphthoquinonediazide photosensitive compound.

4. The photosensitive resin composition according to claim 2, wherein the photosensitive resin composition further comprises at least one of other adhesion promoters.

5. The photosensitive resin composition according to claim 3, wherein based on a solid content of the alkali-soluble phenolic resin varnish and the naphthoquinonediazide photosensitive compound, an added amount of the adhesion promoter is 10-50000 ppm.

* * * * *